United States Patent [19]
Opschoor et al.

[11] Patent Number: 5,113,405
[45] Date of Patent: May 12, 1992

[54] SEMICONDUCTOR DIODE LASER HAVING A STEPPED EFFECTIVE REFRACTIVE INDEX

[75] Inventors: Jan Opschoor; Hubertus P. M. M. Ambrosius, both of Eindhoven, Netherlands

[73] Assignee: U.S. Philips Corp., New York, N.Y.

[21] Appl. No.: 627,074

[22] Filed: Dec. 12, 1990

[30] Foreign Application Priority Data

Dec. 12, 1989 [NL] Netherlands ............... 8903046

[51] Int. Cl.⁵ .................................. H01S 3/19
[52] U.S. Cl. ................................ 372/46; 372/45
[58] Field of Search ................... 372/46, 45, 44, 43

[56] References Cited

U.S. PATENT DOCUMENTS 4,581,742  4/1986  Botez ..................... 372/45

FOREIGN PATENT DOCUMENTS

| 0008890 | 4/1981 | Japan . |
| 0110784 | 5/1988 | Japan ................ 372/43 |
| 0165388 | 7/1988 | Japan . |
| 0165389 | 7/1988 | Japan . |
| 0142692 | 10/1988 | Japan . |
| 0077188 | 3/1989 | Japan ................ 372/43 |

OTHER PUBLICATIONS

Blauvelt et al., "Large optical cavity AlGaAs buried heterostructure window laser", App. Phys Letts., vol. 40, No. 12, Jun. 15, 1982, pp. 1029-1031.

Primary Examiner—Georgia Y. Epps
Attorney, Agent, or Firm—Steven R. Biren

[57] ABSTRACT

Semiconductor diode lasers of the so-called NAM (Non-Absorbing Mirror) type are used due to the high emanating power as writing (and reading) lasers in optical recording systems. The known lasers of this type include both in the active region (13') and in the mirror region (17, 19) a cladding layer (1), which fills a groove and is provided on an absorbing layer (9) (17, 19). The fundamental lateral mode is favored in both regions (13'), (17, 19) by absorption of part of the radiation produced. Due to the absorption in the mirror region (17, 19) mirror degradation occurs, which limits the maximum power and the life of the laser. A new semiconductor diode laser includes in the mirror region (17, 19) a first cladding layer (1'), a radiation-guiding layer (2') and a third cladding layer (6). In the radiation-guiding layer (2'), a radiation guide (15) is formed by an arrangement (12) in the radiation-guiding layer (2'), by which a step is formed in the effective refractive index. Further, the layers (1', 2', 6), which are located in the amplification profile of the radiation guide (15), have a larger band gap than the active layer (3). Due to the particular structure employed, no absorption of radiation occurs in the mirror region (17, 19). As a result, the occurrence of mirror degradation is limited so that lasers are obtained having a high power available and a long life.

14 Claims, 6 Drawing Sheets

SEMICONDUCTOR DIODE LASER HAVING A STEPPED EFFECTIVE REFRACTIVE INDEX

BACKGROUND OF THE INVENTION

The invention relates to a semiconductor diode laser comprising a semiconductor body having a semiconductor substrate of a first conductivity type, on which there are successively disposed at least a first cladding layer of the first conductivity type, an active radiation-emitting layer and a second cladding layer of the second conductivity type, the semiconductor substrate and the second cladding layer being provided with current supply means, coherent electromagnetic radiation being produced in the active layer with a sufficiently high current intensity within an active region forming part of the active layer and located under a strip-shaped region, whose longitudinal direction is substantially perpendicular to a mirror surface located outside the active region, and a radiation-guide being located in an intermediate layer disposed between the mirror surface and the active region, which radiator optically couples the radiation-guiding layer to the mirror surface and is situated in a radiation-guiding layer lying between a third and a fourth cladding layer. The invention further relates to a method of manufacturing such a semiconductor diode laser, in which there are successively disposed on a semiconductor substrate at least a first cladding layer of the first conductivity type, an active radiation-emitting layer and a second cladding layer of the second conductivity type.

Such a semiconductor diode laser, which is of the so-called NAM (=Non-Absorbing Mirror) type, is particularly suitable for use as high-power semiconductor diode laser because also with high radiation powers produced, degradation of the mirror surface is low. Such a laser, in particular when manufactured in the GaAs/AlGaAs material system, is very suitable for use as writing laser in a system for optical recording, such as DOR (=Digital Optical Recording).

Such a semiconductor diode laser and such a method of manufacturing such a semiconductor diode laser are generally known from the article of H. Naito et al entitled "Highly reliable CW operation of 100 mW GaAlAs Buried Twin Ridge Substrate Lasers with Non-absorbing Mirrors" published in the Conference Digest of the 11th I.E.E.E. International Semiconductor Laser Conference, held from 29-8-'88 to 1-9-'88 in Boston (U.S.A.), Paper L-2, pp. 150–151. This article discloses a semiconductor diode laser, in which the radiation guide is formed in the intermediate region in the lateral direction by a step in the effective refractive index, absorption of part of the electromagnetic radiation produced occurring on either side of the radiation guide in a radiation-absorbing layer located within the amplification profile of the radiation produced. The radiation guide is formed in a radiation-guiding layer, which lies on the third cladding layer filling a groove in an absorbing layer. The known method utilizes LPE (=Liquid Phase Epitaxy) to provide inter alia the third cladding layer.

A disadvantage of the known semiconductor diode laser is that, as has been found in practice, with very high optical power degradation of the mirror can occur. This means that especially for the aforementioned applications, in which a high power emanating from the laser is desired, even more suitable semiconductor diode lasers are possible when the degradation of the mirror is further suppressed. The life and the power with which the laser can be used are favorably influenced thereby.

SUMMARY OF THE INVENTION

The present invention has inter alia for its object to provide a semiconductor diode laser which does not or substantially not exhibit any mirror degradation and therefore can produce a very high power and has a long life. The present invention further has for its object to provide a method by which a semiconductor diode laser satisfying the requirements imposed can be manufactured.

The invention is based inter alia on the recognition of the fact that, in the known laser, absorption of part of the electromagnetic radiation produced occurs on either side of the radiation guide in the proximity of a mirror surface.

For this purpose, a semiconductor diode laser of the kind described above is characterized in that the radiation guide is defined in lateral direction by means provided in the radiation-guiding layer, by which a step is formed on either side of the radiation guide in the effective refractive index and the parts of the layers located within the amplification profile of the radiation guide all have a larger band gap than the active layer. Due to the presence of means in the radiation-guiding layer by which a step is formed in the effective refractive index, lateral enclosure of the electromagnetic radiation occurs in the radiation guide. Due to the fact that the parts of the layers located within the amplification profile of the radiation guide, that is to say parts of the radiation-guiding layers, the third and fourth cladding layers, all have a larger band gap than the active layer, no or substantially no absorption of the electromagnetic radiation produced occurs in a semiconductor diode laser according to the invention in the intermediate region. Due to these measures, as a result of which absorption near the mirror is avoided, it is avoided that mirror degradation occurs due to temperature increase or due to reactions occurring with absorption of radiation. This results in that with a semiconductor diode laser according to the invention a high power can be produced, while due to the fact that mirror degradation is suppressed, the life is long. A method of manufacturing such a laser according to the invention is characterized in that within a strip-shaped intermediate region at least the active layer and the overlying layers are removed by etching and within the intermediate layer at least a radiation-guiding layer and a fourth cladding layer are provided in such a manner that the radiation-guiding layer is optically coupled to the active region and that, before the fourth cladding layer is provided, a radiation guide is formed in the radiation-guiding layer in lateral direction by providing means in the radiation guiding layer by which a step is formed on either side of the radiation guide in the effective refractive index. By the method according to the invention, semiconductor diode lasers are obtained which fulfill the requirements imposed.

In a first embodiment of a semiconductor diode laser according to the invention, the step in the effective refractive index on either side of the radiation guide is smaller than about 0.01. By such a comparatively small step in the effective refractive index, the fundamental lateral mode is favored in the radiation guide with the widths thereof desired in practice, which lie between about 1 μm and about 7 μm, and with the thicknesses and compositions of the radiation-guiding layer and the third and fourth cladding layers usual in practice, as can be calculated, which is very desirable. On either side of the active region, a step can be formed in the refractive index, the fundamental lateral mode being relatively favored by absorption of part of the electromagnetic radiation produced by absorbing regions present in situ. The absorption occurring beside the active region does not or substantially not influence the intermediate region adjoining the mirror surfaces so that this absorption does not influence the mirror degradation.

In a further embodiment of a semiconductor diode laser according to the invention, the means consists in that the second radiation-guiding layer is thinner on either side of the radiation guide. A favorable variation is formed by a radiation guide, which, viewed in cross-section, has a stepped profile, the lower side of the layer being substantially flat and the height of the step located on the upper side being small with respect to the thickness of the radiation-guiding layer. For a thickness of the radiation-guiding layer lying, for example, between 0.10 and 0.40 $\mu$m, the height of the step preferably lies between 0.02 and 0.10 $\mu$m. With a radiation-guiding layer comprising, for example, $Al_{0.31}Ga_{0.69}As$ and has a thickness of 0.30 $\mu$m, while the cladding layers comprise $Al_{0.41}Ga_{0.59}As$ and the radiation guide has a width of about 4 $\mu$m, the step in the effective refractive index is about $4*10^{-3}$ for a height of a step of 0.05 $\mu$m and about $8*10^{-3}$ for a height of the step of 0.10 $\mu$m. Such a stepped profile can be formed by means of a strip-shaped mask on the second radiation-guiding layer and by wet chemical etching means, by which a part of the layer outside the mask is removed by etching. In a first embodiment of a method according to the invention, while using anodic oxidation, the radiation-guiding layer is converted outside the mask over part of its thickness into a layer comprising semiconductor material oxides, while at the same time or afterwards this layer comprising semiconductor material oxides is dissolved in an etching step by an etchant which is selective with respect to the radiation-guiding layer. In this manner, as the case may be in several anodic oxidation steps and etching steps, the radiation-guiding layer is locally made thinner in a very accurate manner. In a favorable variation of a semiconductor diode laser according to the invention, a further radiation-guiding layer is located between the active layer and one of the first and second cladding layers. Consequently, a semiconductor diode laser of the so-called LOC (=Large Optical Cavity) type is obtained, as a result of which the electromagnetic radiation produced in the active region will be present partly in the adjoining part of the further radiation-guiding layer. It is particularly favorable when this further radiation-guiding layer is located under the active layer. In this case, the further radiation-guiding layer can serve at the same time as radiation-guiding layer in the intermediate region. As a result, the manufacture of a semiconductor diode laser according to the invention is simplified: a smaller number of layers need now be removed and provided in the intermediate region. Moreover, a very good optical connection, i.e. a low-loss connection, is obtained between the radiation guide and the active region. A great advantage is further that the step of providing the layers in the intermediate region after etching now requires only one growing process because the radiator-guiding layer is already present and need not be provided in a separate growing process.

In a further embodiment of a semiconductor diode laser according to the invention, the means consist in that the composition of the radiation-guiding layer on either side of the radiation guide is modified at least over part of the thickness of said layer in such a manner that on either side of the radiation guide a step is formed in the effective refractive index. Also in this embodiment, no or substantially no absorption of the electromagnetic radiation produced occurs, while the step in the effective refractive index ensures that lateral guiding of the radiation occurs. This step is preferably so small that the fundamental lateral mode constitutes the most stable mode. The modification of the composition required to this end, which is for III-V semiconductor materials about 1 at. %, is smaller than that which can still be obtained in a reproducible manner in a radiation guide of the buried hetero type. In a favorable variation of this embodiment, the composition of the second radiation-guiding layer on either side of the radiation guide is modified by the presence of dopants. Dopants can be added in a simple manner in a sufficiently low concentration. To this end, for example, a diffusion or an implantation may be carried out locally in the radiation-guiding layer. What has been stated with reference to a preceding embodiment with respect to the presence of a further radiation-guiding layer, which is preferably located under the active layer, also applies to this embodiment.

An important embodiment of a semiconductor diode laser according to the invention, in which one of the cladding layers has within the strip-shaped region a larger thickness than outside this region, where a radiation-absorbing layer is located, whose band gap is approximately equal to that of the active layer, which is of the first conductivity type, forms with an adjoining cladding layer a current-blocking p-n junction and is situated within the amplification profile of the further radiation-guiding layer or of the active layer, is characterized in that the first cladding layer has a substantially uniform thickness, the second cladding layer has within the strip-shaped region a larger thickness than on either side of this region and the radiation-absorbing layer is located on either side of the strip-shaped region on the second cladding layer and forms therewith the current-blocking p-n junction. In such a semiconductor diode laser, stabilization of the lateral mode occurs within the radiation-emitting region and the fundamental lateral mode is favored. Such a semiconductor diode laser further has the great advantage that the first cladding layer, the active layer, the radiation-guiding layer, the radiation-absorbing layer and the second cladding layer can be provided by means of MOVPE (=Metal-Organic Vapor Phase Epitaxy) as the growing technique. Since the semiconductor layers in the intermediate region can also be provided by means of MOVPE, a semiconductor diode laser has the great advantage that it can be manufactured solely with the use of MOVPE as the growing technique. This advantage is very important because MOVPE is particularly a growing technique which is suitable for the manufacture on an industrial scale of semiconductor diode lasers. A first variation within this embodiment is characterized in that the second cladding layer is constituted by one semiconductor layer of the second conductivity type, in which at the area of the strip-shaped region over part of the thickness of this layer a MESA is formed, on either side of which the absorbing layer is located. According to the invention, this variation is manufactured in that, after the layers, as far as the third cladding layer inclusive, have been provided, a MESA is etched into the latter layer by means of a strip-shaped mask, the layer being removed outside the mask over part of its thickness, in that on either side of the MESA the radiation-absorbing layer of the second conductivity type is provided, in that then the layers in the intermediate region are removed, as far as the active layer inclusive, by etching by means of a mask, and in that, after the radiation guide has been formed in the first radiation-guiding layer, the fourth cladding layer is provided in the intermediate region. A second variation within this embodiment is characterized in that the second cladding layer is constituted by two semiconductor layers of the second conductivity type, which adjoin each other within the strip-shaped region and are mutually separated outside this region by the radiation-absorbing layer. According to the invention, this variation is manufactured in that, after the first of these two semiconductor layers, for which a comparatively small thickness is chosen, has been provided, the radiation-absorbing layer is provided thereon, in that then by means of a mask the latter layer is removed within the strip-shaped region and in that, after the mask has been removed, the second of these two semiconductor layers is provided, after which the layers in the intermediate layer, as far as the active layer inclusive, are removed by etching by means of a mask and, after the radiation guide has been formed in the first radiation-guiding layer, the fourth cladding layer is provided in the intermediate region.

In a further embodiment of a semiconductor diode laser according to the invention, the fourth cladding layer is of the second conductivity type and at least a further cladding layer of the first conductivity type is disposed on the fourth cladding layer, which further cladding layer forms at least in the intermediate region a current-blocking p-n junction with the fourth cladding layer. Such a semiconductor diode laser has the advantage that it is substantially not possible that charge carriers arrive at the intermediate region near the radiation guide, as a result of which it is avoided that with current passage through the semiconductor diode laser the step in the effective refractive index forming the radiation guide changes. In the case of the first variation of the preceding embodiment, the fourth and further cladding layers may also be provided on either side of the strip-shaped region on top of the radiation-absorbing layer. This has the advantage that an additional current-blocking p-n junction is present on either side of the strip-shaped region without the manufacture of this variation becoming more complicated.

A semiconductor diode laser according to the invention is particularly suitable for obtaining a beam as symmetrical as possible with respect to the emanating electromagnetic radiation, while a high power is present in this beam. For this purpose, a semiconductor diode laser according to the invention is characterized in that the width of the radiation guide is smaller than the width of the active region. Since the thickness of the radiation guide must not be too large, a comparatively symmetrical beam can be obtained by choosing a comparatively small width of the radiation guide. It should be noted that the thickness of the radiation guide is already many times smaller than its width, as a result of which the emanation angle of the beam at right angles to the radiation guide is a few times larger than the emanation angle parallel to the radiation guide. When reducing the width of the radiation guide, the emanation angle parallel to the radiation guide is enlarged.

BRIEF DESCRIPTION OF THE DRAWING

The invention will now be described more fully with reference to two embodiments and the accompanying drawing, in which.

DESCRIPTION OF THE PREFERRED EMBODIMENTS

Figure 1:
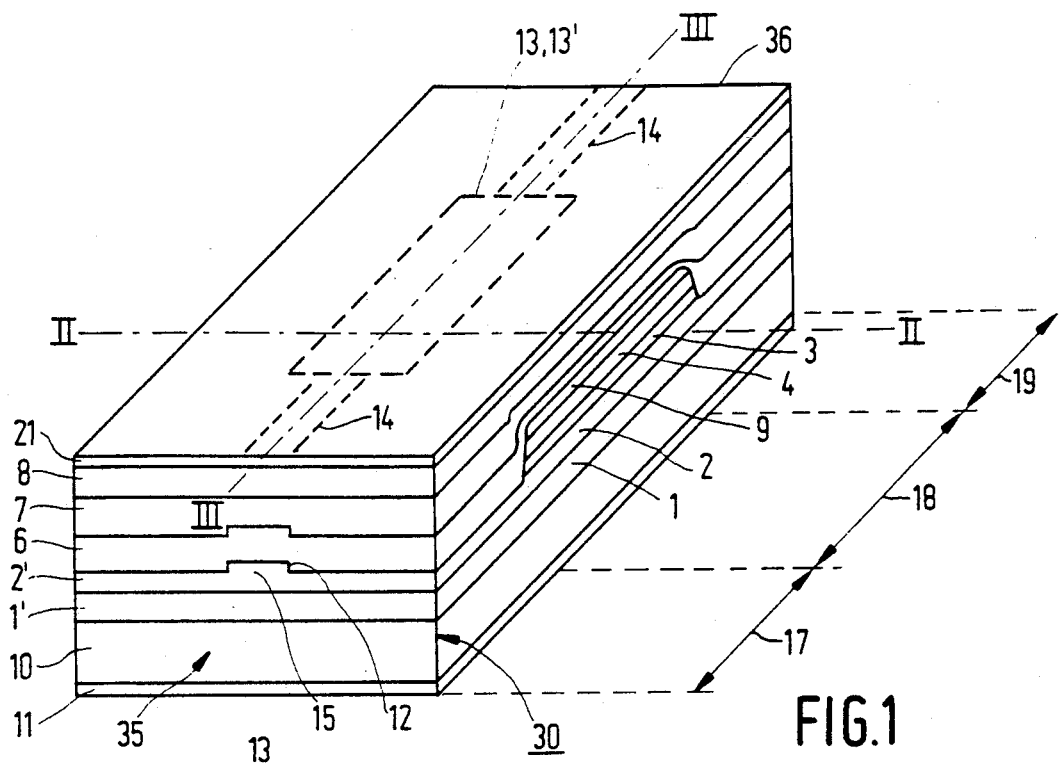
FIG. 1 shows diagrammatically, partly in perspective view and partly in cross-section, a first embodiment of a semiconductor diode laser according to the invention.
Figure 2:
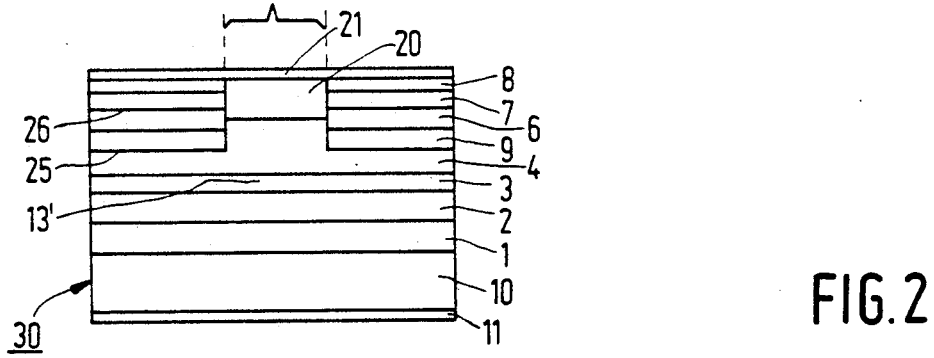
FIGS. 2 and 3 show a cross-section of the semiconductor diode laser of FIG. 1 taken on the line II—II and on the line III—III, respectively, of FIG. 1.
Figure 3:
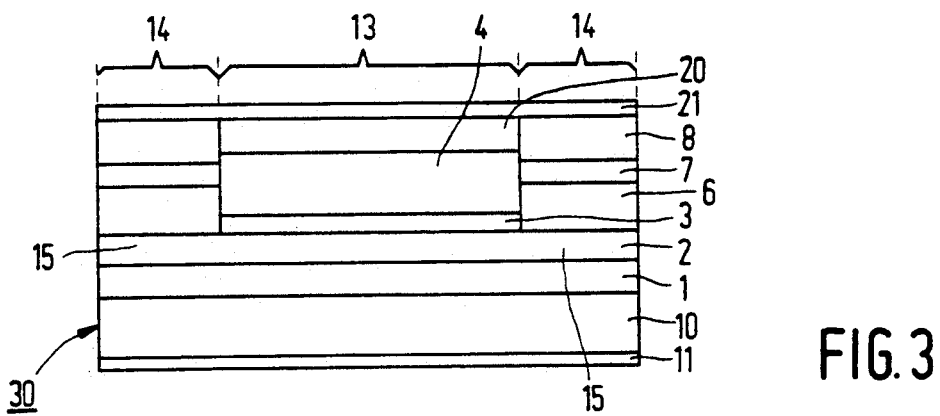

FIG. 1 shows diagrammatically, partly in perspective view and partly in cross-section, a first embodiment of a semiconductor diode laser according to the invention. FIGS. 2 and 3 show a cross-section of the semiconductor diode laser of this embodiment taken on the line II—II and on the line III—III, respectively, of FIG. 1. The semiconductor diode laser comprises a semiconductor body 30 having a substrate region 10 provided with a connection conductor 11 and of a first, here n, conductivity type, which in this embodiment consists of monocrystalline gallium arsenide. Further, there are successively disposed within a strip-shaped region 13 a first cladding layer 1 of the first, here n, conductivity type and having a substantially uniform thickness, a further radiation-guiding layer 2 of the first, here n, conductivity type and coinciding in this embodiment with a radiation-guiding layer 2', an active layer 3, a second cladding layer 4 of the second, here p, conductivity type and a contact layer 20 of the p-conductivity type provided with a connection conductor 21. Under the region 13 is disposed in the active layer 3 an active region 13', in which with a sufficiently high current intensity coherent electromagnetic radiation is produced in the forward direction of the p-n junction formed between the first cladding layer 1 and the second cladding layer 4 within a strip-shaped resonant cavity, which is formed between the mirror surfaces 35, 36 and comprises in this embodiment the active region 13', a subjacent part of the radiation-guiding layer 2 and two radiation guides 15 underlying the regions 14. On either side of the strip-shaped region 13 there are successively provided on the second cladding layer 4 in situ reduced in thickness a radiation-absorbing layer 9 of the second, here D, conductivity type, a fourth cladding layer 6 of the second, here p, conductivity type, two further cladding layers 7, 8 of the first here n, and the second, here p, conductivity type, respectively, and the connection conductor 21. The absorbing layer 9 influences relatively favorably the fundamental lateral mode in the active region 13', while the p-n junction 25 formed between this layer and the second cladding layer 4 and the p-n junction 26 formed between the cladding layers 6, 7 counteract current spread on either side of the active region 13'. The radiation guides 15 are located within an intermediate region 17, 19 located between the region 18 and a mirror surface 35, 36 and in the radiation-guiding layer 2' located between a third cladding layer 1', which in this embodiment coincides with the first cladding layer 1, and the fourth cladding layer 6. In this embodiment, the third cladding layer 1' has a substantially uniform thickness. According to the invention, the semiconductor diode laser of this embodiment has great advantages, such as a good optical coupling between the radiation guide 15 and the active region 13', a simple method of manufacturing (a smaller number of layers need be etched and grown) and the possibility to use MOVPE as growing technique. It is prevented by the current-blocking p-n junction 26 formed between the second cladding layer 6 and the further cladding layer 7 that in the intermediate region 17, 19 the refractive index is influenced by charge carriers. Further, this current blocking counteracts recombination in the intermediate region, as a result of which mirror degradation is counteracted. In this embodiment, the further radiation-guiding layer 2 is located under the active layer 3, which according to the invention has the advantage that, when removing the active layer 3 in the intermediate region 17, 19, the further radiation-guiding layer 2 need not be removed and can also serve as radiation-guiding layer 2'. According to the invention, the radiation guide 15 is formed with the aid of means 12 arranged in the radiation-guiding layer 2', by which on either side of the radiation guide 15 a step is formed in the effective refractive index, at which part of the electromagnetic radiation produced is scattered. Due to the fact that in the intermediate region 17, 19 no absorption of the radiation produced takes place, the occurrence of mirror degradation is counteracted in accordance with the invention. In this embodiment, the means 12 consist in a reduced thickness of the radiation-guiding layer 2' on either side of the radiation guide 15. The height of the step formed is 400 Å. Such a step can be formed in a simple manner by etching with the use of a mask and preferably with the use of anodic oxidation before or during etching, in which event a selective etchant is used, in which the oxide formed is dissolved, but the semiconductor material is not dissolved. The width of the radiation guide 15 is about 3 μm and the length, which corresponds to the width of the intermediate region 17, 19 is about 10 μm, while the length and the width of the strip-shaped region 13 are about 300 μm and 4 μm, respectively. By choosing the width of the radiation guide 15 smaller than the width of the strip-shaped region 13, according to the invention an emanating beam of radiation is obtained having a comparatively large symmetry, having a high output power and operating in the fundamental lateral mode. The dimensions of the semiconductor body are about 300×320 μm². In this embodiment, the second cladding layer 4 has within the strip-shaped region 13 a larger thickness than on either side thereof where the radiation-absorbing layer 9 is located. This locally larger thickness is obtained in that a MESA is formed in the second cladding layer 4 at the area of the strip-shaped region 14. This means that the second cladding layer 4 can be provided as an initially flat layer, which can also be effected by means of, for example, MOVPE, which is advantageous. The absorbing layer 9 can also be provided by means of MOVPE. Within the active region 13' radiation having a high power can be produced due to the comparatively large width of this region and due to the presence of the further radiation-guiding layer 2. For a survey of the properties of the semiconductor layers in this embodiment, reference is made to the following table. The connection conductors comprise the metals or metal alloys usual for the GaAs/AlGaAs and have a usual thickness.

| Layer: | Semiconductor: | Type: | Doping conc.: (at/cm³) | Thickness: (μm) |
|---|---|---|---|---|
| 10 | GaAs (substr.) | N | $2 \times 10^{18}$ | 350 |
| 1,1' | $Al_{0.4}Ga_{0.6}As$ | N | $2 \times 10^{18}$ | 1 |
| 2,2' | $Al_{0.3}Ga_{0.7}As$ | N | $2 \times 10^{18}$ | 0.3 |
| 3 | $Al_{0.1}Ga_{0.9}As$ | | | 0.15 |
| 4 | $Al_{0.4}Ga_{0.6}As$ | P | $2 \times 10^{18}$ | 1.5 (0.2) |
| 6 | $Al_{0.4}Ga_{0.6}As$ | P | $2 \times 10^{18}$ | 0.5 |
| 7 | $Al_{0.4}Ga_{0.6}As$ | N | $2 \times 10^{17}$ | 0.6 |
| 8 | $Al_{0.4}Ga_{0.6}As$ | P | $2 \times 10^{17}$ | 0.6 |
| 9 | GaAs | N | $2 \times 10^{17}$ | 0.4 |
| 20 | GaAs | P | $2 \times 10^{18}$ | 1 |

Figure 4A:
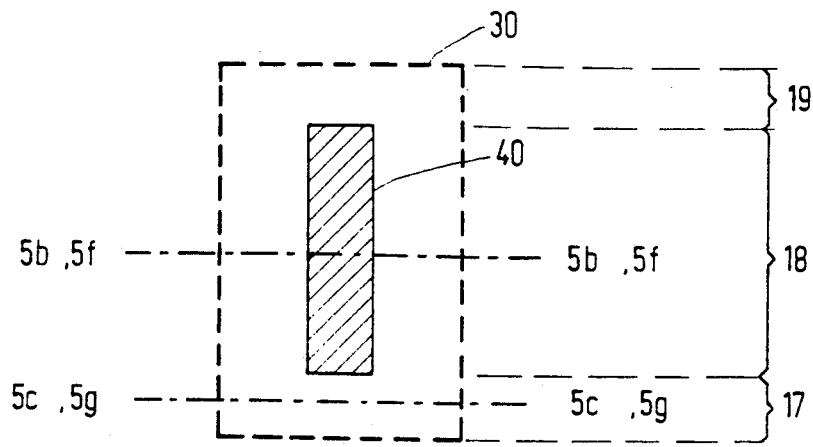
FIGS. 4a to 4c show in plan view the masks used in the manufacture of the semiconductor diode laser shown in FIG. 1.
Figure 4B:
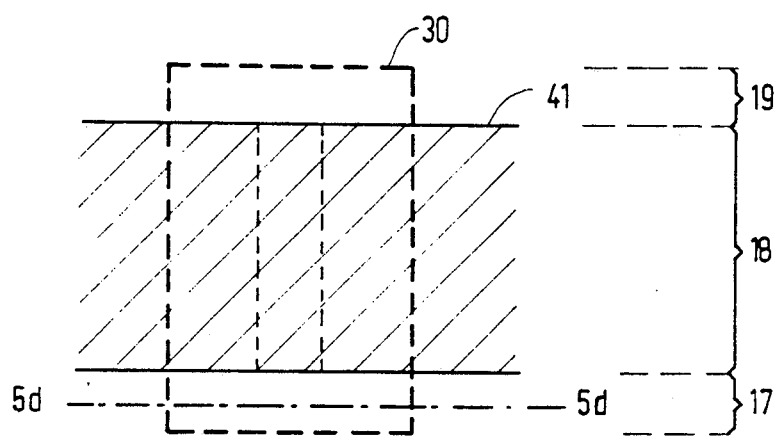
Figure 4C:
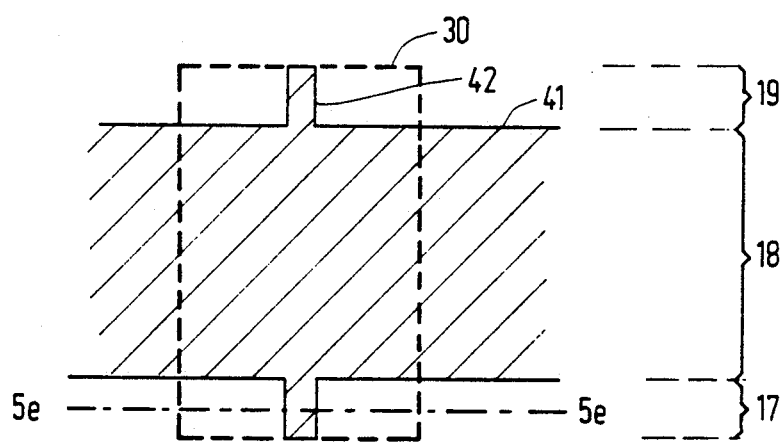
Figure 5A:
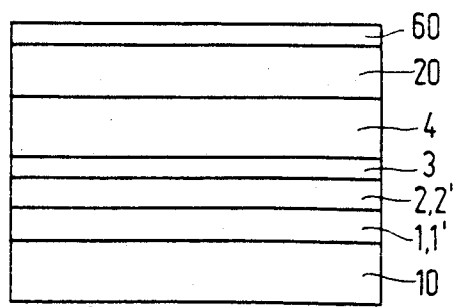
FIGS. 5a to 5g show in a cross-section parallel to the plane of drawing of FIG. 1 the semiconductor diode laser of FIG. 1 at successive stages of manufacture, the position of the cross-section being indicated, as far as necessary in FIGS. 4a to 4c.
Figure 5E:
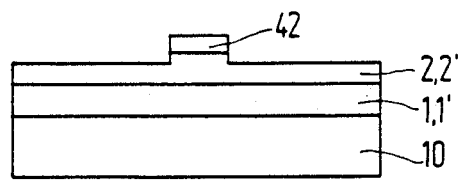
Figure 5B:
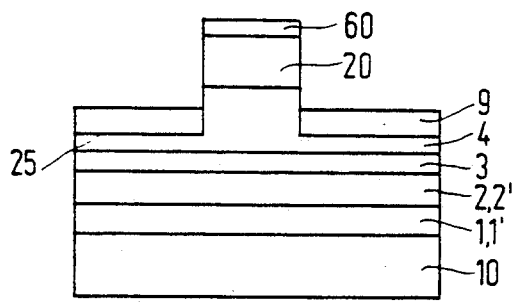
Figure 5F:
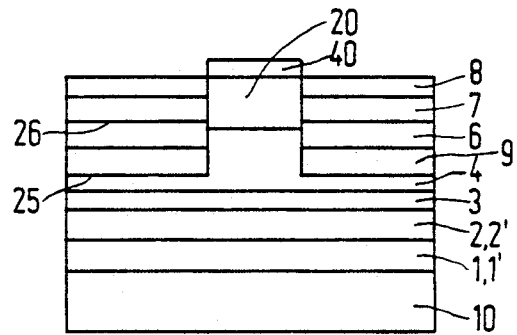
Figure 5C:
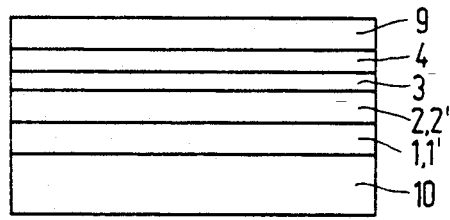
Figure 5D:
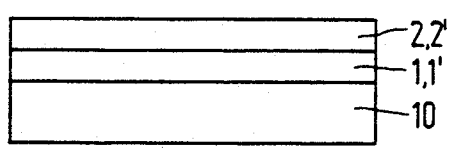
Figure 5G:
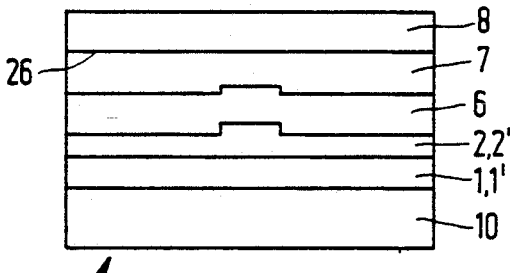

It will now be indicated with reference to FIGS. 4 and 5 how the semiconductor diode laser described is manufactured in accordance with the invention. FIG. 4 shows in plan view the masks 40, 41, 42 successively used in the manufacture. The dimensions of these masks 40, 41, 42 are chosen in accordance with the dimensions of the semiconductor diode laser to be formed and the regions located within this laser. FIG. 5 shows in a cross-section the semiconductor diode laser of FIG. 1 at successive stages of manufacture, the position of the cross-section being indicated, as far as necessary, in FIG. 4. After a (001) GaAs substrate 10 has been polished and etched, in order of succession a first cladding layer 1, a radiation-guiding layer 2, 2', an active layer 3, a second cladding layer 4 and a contact layer 20 are provided on this substrate by means of MOVPE as growing technique. The thickness, the composition and the conductivity type of each layer are chosen as indicated above. The n-type doping source used is SiH4 and the p-type doping source used is DEZn (=diethyl zinc). Subsequently, a 0.7 μm thick layer 60 of SiO2 is applied by means of sputtering (see FIG. 5a). In this layer a strip-shaped mask 40 is formed within the region corresponding to the semiconductor body 30 to be formed (see FIG. 4a). Then the semiconductor layers 20 and 8 are removed outside the mask 40 or etched to a reduced thickness by means of usual etchants. Subsequently, by means of MOVPE, a radiation-absorbing layer 9 is provided outside the mask 40. FIGS. 5b and 5c show a cross-section of the resulting structure within the regions 18 and 17, respectively, as indicated in FIG. 4a. By means of photoresist and photolithography, a mask 41 is then formed, as indicated in FIG. 4b. The radiation-absorbing layer 9, the second cladding layer 4 and the active layer are removed by etching outside this mask in the regions 17 and 19. A cross-section of the resulting structure in these regions is shown in FIG. 5d. Subsequently, a fresh photoresist mask 41, 42 (see FIG. 4c) is provided, which comprises a strip-shaped region 42 located in the intermediate region 17, 19. By means of anodic oxidation, a small part (about 400 Å) of the radiation-guiding layer 2 outside the mask is then converted into a layer comprising semiconductor material oxides, which is subsequently removed in a solution of ammonium diluted with water (see FIG. 5e). After the photoresist has been removed and after cleaning, in order of succession a fourth cladding layer 6, a further cladding layer 7 and another cladding layer 8 are provided outside the mask 40 comprising $SiO_2$ by means of MOVPE. A cross-section of the resulting structure along the lines indicated in FIG. 4a is shown in FIGS. 5f and 5g. After the mask layer 60 has been removed, connection conductors are provided in a usual manner, whereupon after a cleaving operation, in which the mirror surfaces are formed, the semiconductor diode laser of FIG. 1 is obtained. In the method according to the invention, means 12 are provided in the radiation-guiding layer 2', which in this case coincides with the radiation-guiding layer 2, by which means on either side of the radiation guide 15 to be formed a step is formed in the effective refractive index, at which part of the radiation produced is scattered. Such a method has the advantage that MOVPE can be used here as growing technique. The fact that the radiation-guiding layers 2, 2' coincide and that these layers are positioned under the active layer 3 has the advantage that the method is simplified: on the one hand, the number of layers to be etched is smaller, while on the other hand the number of layers to be provided in all is smaller. The step of providing a stepped profile 12 in the second radiation-guiding layer 2' within the intermediate region 17, 19 is a processing step that can be carried out in a simple manner. The anodic oxidation used to this end according to the invention, in which the layer formed comprising semiconductor material oxides is removed by etching selectively with respect to the second radiation-guiding layer 2', has the advantage that the step in the effective refractive index forming the radiation guide 15 can now be adjusted in an accurately controlled manner. The method according to the invention further has the advantage that the semiconductor layers within the region 18 can also be provided be means of MOVPE. Thus, the method according to the invention offers the possibility of manufacturing solely with the use of MOVPE as growing technique of the semiconductor layers the semiconductor diode laser according to the invention. In view of the aforementioned advantages of the MOVPE technique, this means that the method according to the invention is a particularly favorable manufacturing method.

Figure 6:
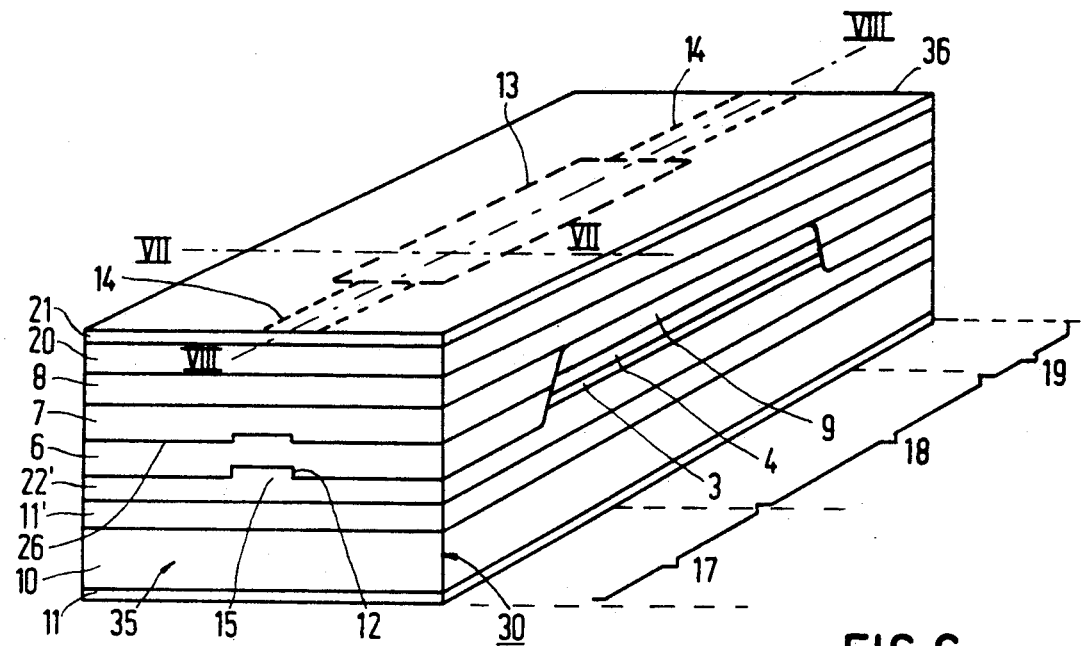
FIG. 6 shows diagrammatically, partly in perspective view and partly in cross-section, a second embodiment of a semiconductor diode laser according to the invention.
Figure 7:
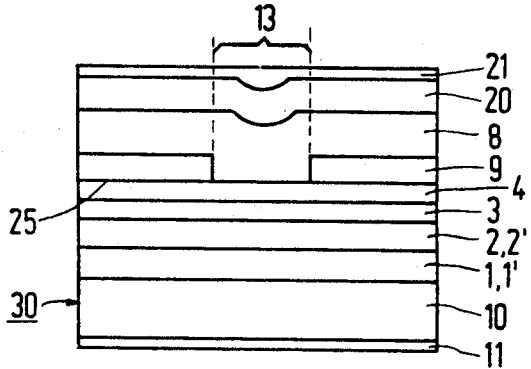
FIGS. 7 and 8 show a cross-section of the semiconductor diode laser shown in FIG. 6 taken on the line VII—VII and on the line VIII—VIII, respectively, of FIG. 6.
Figure 8:
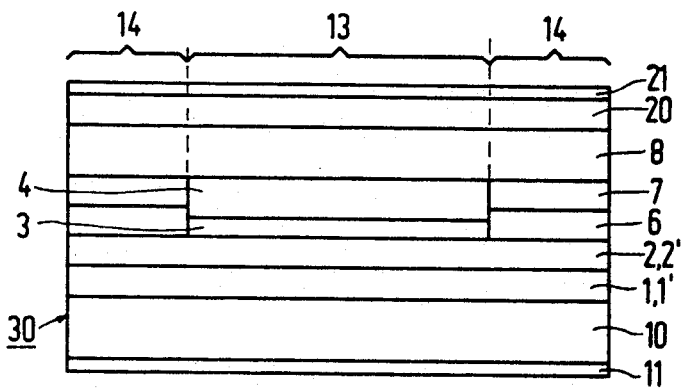

FIG. 6 shows diagrammatically, partly in perspective view and partly in cross-section, a second embodiment of a semiconductor diode laser according to the invention. The semiconductor diode laser comprises a semiconductor body 30 having a substrate region 10 of the first, in this case D, conductivity type, which is provided with a connection conductor 11 and consists in this embodiment of monocrystalline gallium arsenide. On this substrate are disposed successively within a strip-shaped region 13 a first cladding layer 1 of the first, in this case n, conductivity type, a radiation-guiding layer 2' of the first, here n, conductivity type and coinciding in this embodiment with a further radiation-guiding layer 2, an active radiation-emitting layer 3, a second cladding layer comprising two semiconductor layers 4, 8 of the second, here p, conductivity type and a contact layer 20 of the p-conductivity type provided with a connection conductor 21, which layers all extend also on either side of the strip-shaped region 13. In this embodiment, the further radiation-guiding layer 2 is located under the active layer 3, which according to the invention has the advantages mentioned with reference to the first embodiment. A radiation-absorbing layer 9 of the second, here n, conductivity type is located on either side of the strip-shaped region 13 between the semiconductor layers 4 and 8. A strip-shaped radiation-emitting active region 13' is located under the region 13 in the active layer 3. The radiation guides 15 are located in an intermediate region 17, 19 located between the active region 13' and a mirror surface 35, 36, where the radiation-guiding layer 2' is located between a third cladding layer 1', which in this embodiment coincides with the first cladding layer 1 and has a substantially uniform thickness at the area of the radiation guides 15, and a fourth cladding layer 6. The radiation guides 15 connect the active region 13' optically to the mirror surface 35, 36 and are formed with the aid of means 12 provided in the radiation-guiding layer 2', by which a step is formed in the effective refractive index on either side of the radiation guide 15 in that part of the electromagnetic radiation produced is scattered. This has the advantages mentioned above with reference to the first embodiment. Also in this embodiment, the means 12 consist in a reduced thickness of the second radiation-guiding layer 2' on either side of the radiation guide 15. The height of the step formed is 400 Å. The dimensions of the semiconductor diode laser in this embodiment and of the regions located therein are equal to those in the first embodiment. Also in this embodiment, the thick cladding layer 4 has a larger thickness within the strip-shaped region 14 than on either side thereof where the radiation-absorbing layer 9 is located, which forms with the second cladding layer 4 a current-blocking p-n junction 25, which has the advantage mentioned with reference to the first embodiment. This locally larger thickness is obtained in that the second cladding layer 4, 8 is formed by two semiconductor layers 4, 8 of the second, here p, conductivity type, which adjoin each other at the area of the strip-shaped region 13 and are mutually separated on either side of this region by the radiation-absorbing layer 9. The second cladding layer and the radiation-absorbing layer can be provided, for example, by means of MOVPE, which is advantageous. Within the strip-shaped region 14, an index guiding of the radiation produced with which absorption of part of this radiation occurs is obtained in the active layer 3. As a result, higher lateral modes are suppressed and, also due to the comparatively large width of the strip-shaped region 14, a high power can be produced. According to the invention, also in this embodiment, the fourth cladding layer 6, which in this embodiment is of the second, so p, conductivity type, is provided with a further cladding layer 7 of the first, here n, conductivity type, which forms with the fourth cladding layer 6 a current-blocking p-n junction 26, which has the advantage mentioned with reference to the first embodiment. FIGS. 7 and 8 show a cross-section of the semiconductor diode laser of this embodiment, which cross-sections are taken on the lines VII—VII and VIII—VIII, respectively, of FIG. 6. For a survey of the properties of the semiconductor layers in this embodiment, reference is made to the table given above. The connection conductors are the same as in the first embodiment.

Figure 9A:
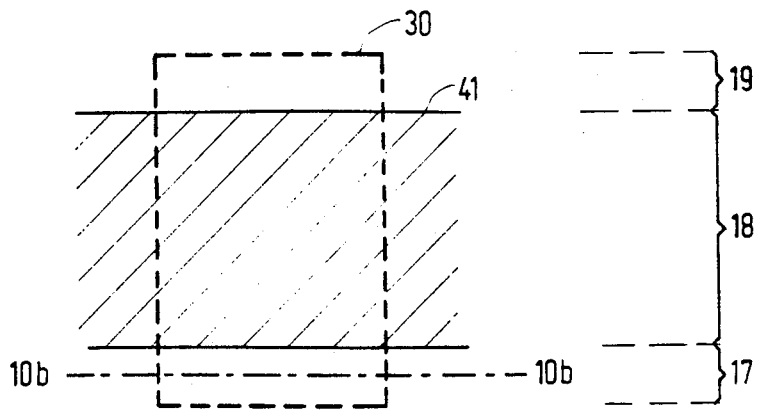
FIGS. 9a to 9c show in plan view the masks used in the manufacture of the semiconductor laser shown in FIG. 6.
Figure 9B:
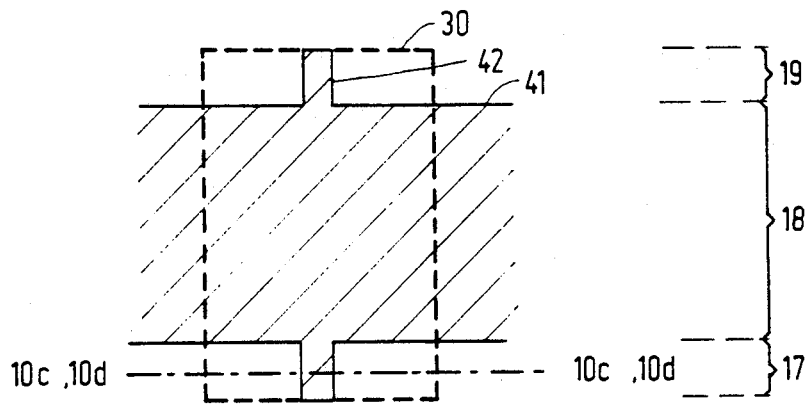
Figure 9C:
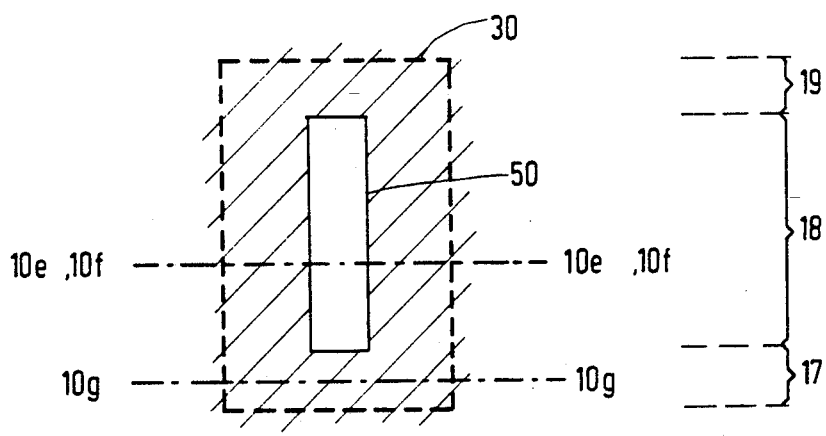
Figure 10A:
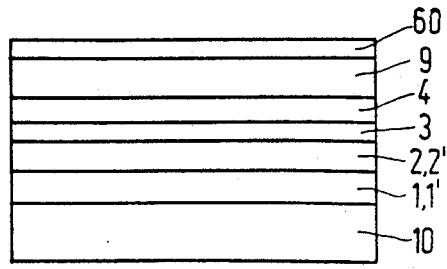
FIGS. 10a to 10g show in a cross-section parallel to the plane of the drawing of FIG. 6 the semiconductor diode laser of FIG. 6 at successive stages of manufacture, the position of the cross-section being indicated, as far as necessary, in FIGS. 9a to 9c.
Figure 10E:
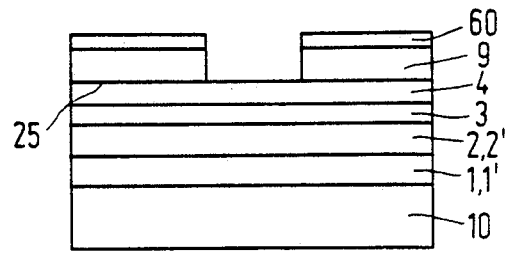
Figure 10B:
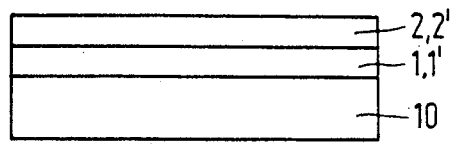
Figure 10C:
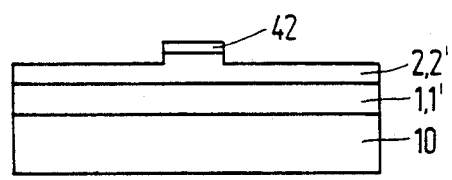
Figure 10F:
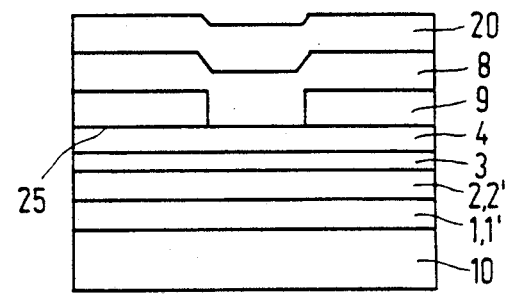
Figure 10D:
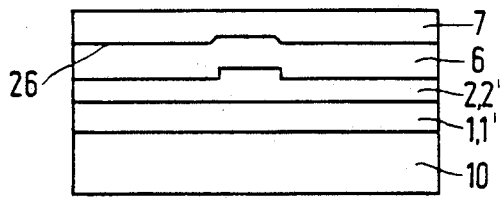
Figure 10G:
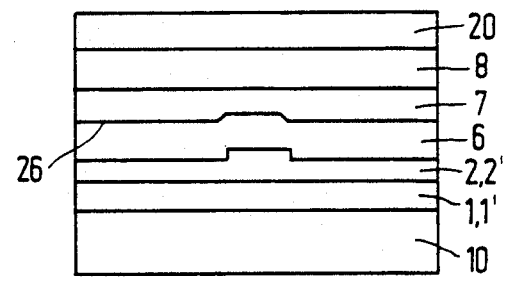

With reference to FIGS. 9 and 10, there will now be indicated how the semiconductor diode laser described is manufactured in accordance with the invention. FIG. 9 shows in plan view the masks 41, 42, 50, which are used successively in the manufacture. The dimensions of these masks are the same as in the first embodiment. FIG. 10 shows in a cross-section the semiconductor diode laser of FIG. 7 at successive stages of manufacture, the position of the cross-section being indicated, as far as required, in FIG. 9. After a (001) GaAs substrate 10 has been polished and etched, in order of succession a first cladding layer 1, a radiation-guiding layer 2' coinciding in this embodiment with a further radiation-guiding layer 2, an active layer 3, a semiconductor layer 4 of the second, here p, conductivity type having a thickness of about 0.3 $\mu$m and a radiation-absorbing layer 9 are provided thereon by means of MOVPE as growing technique. The thickness, the composition and the conductivity type of each layer are then chosen, as far as is not indicated here otherwise, in accordance with the table given in the first embodiment. Subsequently, a 0.3 $\mu$m thick layer 60 of $SiO_2$ is applied by means of sputtering (see FIG. 10a). In this layer a mask 41 is formed within a region corresponding to the semiconductor body 30 (see FIG. 9a). Then the semiconductor layers 3, 4 and 9 are removed outside the mask 41 by means of usual etchants (see FIG. 10b). By means of photoresist and photolithography, a mask 41, 42 is then formed, as indicated in FIG. 9b. Subsequently, by means of anodic oxidation, a small part (about 400 Å) of the radiation-guiding layer 2' outside the mask is converted into a layer comprising semiconductor material oxides, which is then removed in a solution of ammonium diluted with water (see FIG. 10c). After the photoresist has been removed and after cleaning, in order of succession the fourth cladding layer 6 and the further cladding layer 7 are provided outside the mask 41 comprising $SiO_2$ by means of MOVPE. A cross-section of the resulting structure at the area of the intermediate region 17, 19 is shown in FIG. 10d. After the mask layer 41, 42 has been removed, by means of photolithography and etching the mask 50 shown in FIG. 9c is formed in the mask layer 60. By means of an etchant, for example a selective etchant, the radiation-absorbing layer 9 is removed within the strip-shaped region 13 (see FIG. 10e). After the photoresist and the mask layer 60 have been removed and after cleaning, in order of succession the semiconductor layer 8 of the second conductivity type having a thickness of about 1 $\mu$m and forming together with the semiconductor layer 4 the second cladding layer and the contact layer 20 are provided by means of MOVPE. A cross-section of the resulting structure at the areas indicated in FIG. 9c is shown in FIGS. 10f and 10g. After the connection conductors have been provided and the cleaving operation has been carried out, the semiconductor diode laser of FIG. 7 is obtained. In the method according to the invention, in the second radiation-guiding layer 2', which coincides in this case with the first radiation-guiding layer 2, means 12 are provided in the second radiation-guiding layer 2, by which on either side of the radiation guide 15 to be formed in this layer a step is formed in the effective refractive index in that part of the radiation produced is scattered. Such a method has the advantages mentioned with reference to the manufacture of the semiconductor diode laser of the first embodiment. The method according to the invention of this embodiment also has the advantage that also the semiconductor layers within the region 18 can be provided by means of MOVPE. Thus, also this method according to the invention provides the possibility of obtaining the semiconductor diode laser according to the invention of this embodiment solely with the use of MOVPE as growing technique of the semiconductor layers.

It should be noted that in the masks shown in FIGS. 4 and 9 only the pattern required for the formation of a semiconductor diode laser is shown. Actually, the pattern is reciprocating and is adapted so that a bidimensional matrix of adjoining semiconductor diode lasers is obtained.

The invention is not limited to the embodiments described because many modifications and variations are possible within the scope of the invention for those skilled in the art. For example, the stepped profile with which the radiation guide is formed may also be present on the lower side of the radiation-guiding layer. Further, a stepped profile may be present both on the upper side and on the lower side of this layer. A possible further variation consists in that within the strip-shaped region an index guiding obtained by absorption of radiation by means of a first cladding layer, which fills a groove and is situated above a current-blocking and radiation absorbing layer. The groove required to this end is situated solely in the strip-shaped region. For example, the radiation-guiding layer is then present on the first cladding layer, while the radiation-absorbing layer is located on either side of the strip-shaped region within the amplification profile of said radiation-guiding layer. In the intermediate region the radiation guide is then formed in the same manner as in the embodiments described above. Other variations are obtained inter alia when semiconductor materials or compositions other than those mentioned in the embodiments are used. For example, the radiation-absorbing layer on either side of the active region may be replaced by a non-absorbing layer, whose semiconductor material is chosen so that the band gap is larger than the band gap of the active layer and that a step in the effective refractive index is formed on either side of the active region in a similar manner as in the intermediate region. Due to the fact that absorption thus does not occur on either side of the active region, semiconductor diode lasers having a lower starting current and a higher efficiency are obtained. When also this step in the effective refractive index is made sufficiently small, lasers are obtained which operate in the fundamental lateral mode. Through a comparatively narrow active region a comparatively low starting current is obtained, while further—when the radiation guide is also comparatively narrow—a good coupling from the active region to the radiation guide is obtained. Moreover, the current blocking may be realized instead of by current-blocking p-n junctions by one or more high-ohmic semiconductor layers. Furthermore, a so-called buffer layer may be provided between the first cladding layer and the semiconductor substrate. Although at least for discrete semiconductor diode lasers the current supply means mostly consist of highly doped layers or regions provided with a conductive layer, on which a connection conductor, for example in the form of a wire, is provided, these means may also comprise other well known current supply means, such as an electron beam etc. In the embodiments described, two intermediate regions, in each of which a radiation guide is located, are present. However, it is quite possible to form a radiation guide only in an intermediate region. The active layer and the first radiation-guiding layer then adjoin one of the mirror surfaces. Other measures may then be taken at this mirror surface in order to counteract mirror degradation, such as the provision of a mirror coating.

The invention is not limited either to the method given in the embodiments. Although it is a great advantage of this method that MOVPE can be used as growing technique, in a method according to the invention use may also be made of other growing techniques, such as VPE (=Vapour Phase Epitaxy), MBE (=Molecular Beam Epitaxy), CBE (=Chemical Beam Epitaxy) or the aforementioned LPE technique. In the aforementioned variation, in which the first cladding layer is formed in and beside the strip-shaped region by a semiconductor layer filling a groove, it is even necessary to use LPE. It is further possible to provide in a method according to the invention the means "in situ" in the second radiation-guiding layer. This may be effected, for example, in that, when growing this layer, for example by means of a radiation beam, the composition is varied on either side of the radiation guide to be formed. This modification may relate, for example, to the elements forming the mixed crystal or to the doping elements.

We claim:

1. A semiconductor diode laser comprising a semiconductor body (30) having a semiconductor substrate (10) of a first conductivity type, on which are successively disposed at least a first cladding layer (1) of the first conductivity type, an active radiation-emitting layer (3) a second cladding layer (4) of the second conductivity type, the semiconductor substrate (10) and the second cladding layer (4) being provided with current supply means (8, 11, 21) within an active region (13'), which forms part of the active layer (3), is located under a strip-shaped region (13), and whose longitudinal direction is substantially perpendicular to a mirror surface (35, 36) located outside the active region (13'), in which coherent electromagnetic radiation is produced with a sufficiently high current intensity in the forward direction, and in which in an intermediate region (17, 19) located between the mirror surface (35, 36) and the active region (13') a radiation guide (15) is disposed, which optically couples the active region (13') to the mirror surface (35, 36) and is present in a radiation-guiding layer (2') located between a third cladding layer (1') and a fourth cladding layer (6), characterized in that the radiation guide (15) is defined in lateral direction with the aid of means (12) arranged in the radiation-guiding layer (2'), for forming a step in the effective refractive index on either side of the radiation guide (15), and the parts of the layers (1', 2', 6) located within the amplification profile of the radiation guide (15) all having a larger band gap than the active layer (3).

2. A semiconductor diode laser as claimed in claim 1, characterized in that the step in the refractive index by which the radiation guide (15) is formed is smaller than about 0.01.

3. A semiconductor diode laser as claimed in claim 1, characterized in that the means (12) comprise a reduced thickness of the radiation-guiding layer (2') on either side of the radiation guide (15).

4. A semiconductor diode laser as claimed in claim 1, characterized in that the third cladding layer (1') has a substantially uniform thickness and the radiation-guiding layer (2') has, viewed in a section transverse to the radiation guide (15), a stepped profile, the lower side of the layer (2') being substantially flat and the height of the step located on the upper side being small with respect to the thickness of the radiation-guiding layer (2').

5. A semiconductor diode laser as claimed in claim 3, characterized in that the thickness of the radiation-guiding layer (2') lies between 0.10 and 0.40 μm, the height of the step lies between 0.01 and 0.1 μm and the width of the radiation guide (!5) lies between 1 and 7 μm.

6. A semiconductor diode laser as claimed in claim 1, characterized in that the means (12) comprise the composition of the radiation-guiding layer (2') on either side of the radiation guide (15) being varied over at least part of the thickness of the layer (2') in such a manner that a step is formed in the effective refractive index on either side of the radiation guide (15).

7. A semiconductor diode laser as claimed in claim 6, characterized in that the means (12) comprise the composition of the radiation-guiding layer (2') on either side of the radiation guide (15) or at the area of this guide being varied by the presence of doping elements.

8. A semiconductor diode laser as claimed in claim 1, characterized in that a further radiation-guiding layer (2) is present between the active layer (3) and one of the first (1) and second (4) cladding layers.

9. A semiconductor diode laser as claimed in claim 1, characterized in that the further radiation-guiding layer (2) is located between the first cladding layer (1) and the active layer (3) and the radiation-guiding layer (2') and the further radiation-guiding guiding layer (2) as well as the first cladding layer (1) and the third cladding layer (1') coincide with each other.

10. A semiconductor diode laser as claimed in claim 1, in which one of the cladding layers (1, 4) has within the strip-shaped region (13) a larger thickness than outside this region, where a radiation-absorbing layer (9) is located, whose band gap is substantially equal to that of the active layer (3), which is of the first conductivity type, forms with an adjoining cladding layer (1, 4) a current-blocking p-n junction (25) and is located within the amplification profile of the further radiation-guiding layer (2) or of the active layer (3), characterized in that the first cladding layer (1) has a substantially uniform thickness, the second cladding layer (4) has within the strip-shaped region (13) a larger thickness than on either side thereof and the radiation-absorbing layer (9) is located on either side of the strip-shaped region (13) on the second cladding layer (4) and forms therewith the current-blocking p-n junction (25).

11. A semiconductor diode laser as claimed in claim 10, characterized in that the second cladding layer is constituted by one semiconductor layer (4) of the second conductivity type, in which at the area of the strip-shaped region (13) a MESA (16) is formed over part of the thickness of the semiconductor layer, on either side of which MESA the radiation-absorbing layer (9) is located.

12. A semiconductor diode laser as claimed in claim 10, characterized in that the second cladding layer (4, 8) is constituted by two semiconductor layers (4), (8) of the second conductivity type, which adjoin each other within the strip-shaped region (13) and are mutually separated on either side thereof by the radiation-absorbing layer (9).

13. A semiconductor diode laser as claimed in claim 9, characterized in that the fourth cladding layer (6) is of the second conductivity type and the fourth cladding layer (6) is provided with at least a further cladding layer (7) of the first conductivity type, which forms at least in the intermediate region (17, 19) with the fourth cladding layer (6) a current-blocking p-n junction.

14. A semiconductor diode laser as claimed in claim 1, characterized in that the width of the radiation guide (15) is smaller than the width of the active region (13').

* * * * *